(12) United States Patent
Jung (10) Patent No.: US 9,209,161 B2
(45) Date of Patent: Dec. 8, 2015

(54) STACKED PACKAGE AND METHOD FOR MANUFACTURING THE SAME

(71) Applicant: SK hynix Inc., Icheon-si Gyeonggi-do (KR)

(72) Inventor: Young Berm Jung, Cheongji-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/154,761

(22) Filed: Jan. 14, 2014

(65) Prior Publication Data

US 2015/0028472 A1   Jan. 29, 2015

(30) Foreign Application Priority Data

Jul. 26, 2013   (KR) .......................... 10-2013-0088776

(51) Int. Cl.
| | | |
|---|---|---|
| *H01L 29/40* | (2006.01) | |
| *H01L 25/065* | (2006.01) | |
| *H01L 25/00* | (2006.01) | |
| *H01L 23/31* | (2006.01) | |
| *H01L 23/498* | (2006.01) | |

(52) U.S. Cl.
CPC ............ *H01L 25/0657* (2013.01); *H01L 25/50* (2013.01); *H01L 23/3128* (2013.01); *H01L 23/49816* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73203* (2013.01); *H01L 2224/73204* (2013.01); *H01L 2224/73215* (2013.01); *H01L 2224/73253* (2013.01); *H01L 2224/73257* (2013.01); *H01L 2224/73265* (2013.01); *H01L 2224/92143* (2013.01); *H01L 2225/0651* (2013.01); *H01L 2225/06513* (2013.01); *H01L 2225/06517* (2013.01); *H01L 2225/06541* (2013.01); *H01L 2225/06558* (2013.01); *H01L 2225/06562* (2013.01); *H01L 2924/15311* (2013.01)

(58) Field of Classification Search
CPC .................. H01L 25/0657; H01L 2924/1079; H01L 2924/15311; H01L 2924/14; H01L 2224/48091
USPC ................................... 257/777–180
See application file for complete search history.

(56) References Cited

U.S. PATENT DOCUMENTS

| | | | |
|---|---|---|---|
| 8,169,058 B2 | 5/2012 | Pagaila et al. | |
| 8,409,922 B2 * | 4/2013 | Camacho et al. | ............. 438/109 |
| 2009/0309239 A1 * | 12/2009 | Nishimura et al. | ........... 257/778 |

FOREIGN PATENT DOCUMENTS

KR   1020100039692 B1   4/2010

\* cited by examiner

*Primary Examiner* — Quoc Hoang
(74) *Attorney, Agent, or Firm* — William Park & Associates Ltd.

(57) ABSTRACT

The stacked package includes: a substrate having an upper surface formed with connection pads, a lower surface, and four side surfaces; a first semiconductor chip mounted over the upper surface of the substrate; a first adhesive member that covers a portion of the substrate including the first semiconductor chip; and a second semiconductor chip formed with bumps on edges of a first surface and mounted over the substrate with interposition of the first semiconductor chip and the first adhesive member such that a center of the first surface is attached over the first adhesive member and the bumps are bonded onto the connection pads, with a second surface opposing to the first surface being polished evenly.

19 Claims, 7 Drawing Sheets

STACKED PACKAGE AND METHOD FOR MANUFACTURING THE SAME

CROSS-REFERENCES TO RELATED APPLICATIONS

The present application claims priority under U.S.C. 119 (a) to Korean patent application number 10-2013-0088779 filed on Jul. 26, 2013, in the Korean Intellectual Property Office, which is incorporated herein by reference in its entirety.

BACKGROUND

1. Technical Field

The disclosure relates to a semiconductor technology, and more particularly, to a stacked package and a method for manufacturing the same.

2. Related Art

In the semiconductor industry, packaging technologies for integrated circuits have been continuously been developed to satisfy the demands toward miniaturization and mounting reliability. In recent years, as miniaturization and high performance are demanded in electric and electronic products, various stacking techniques have been developed.

The term "stack" as used in the semiconductor industry means to pile vertically two or more semiconductor chips or semiconductor packages. With these stacking technologies, a memory element may have a memory capacity two or more times greater than that obtainable through semiconductor integration process. Besides the increased memory capacity, the stacked packages also have advantages in terms of mounting density and efficient utilization of a mounting area. For these reasons, research and development for stacked packages have been accelerated.

SUMMARY

Various embodiments are generally directed to a stacked package with an increased number of stacked chips and a method for manufacturing the same.

In an embodiment of the present invention, a stacked package includes: a substrate having an upper surface formed with connection pads, a lower surface, and four side surfaces; a first semiconductor chip mounted over the upper surface of the substrate; a first adhesive member that covers a portion of the upper surface of the substrate including the first semiconductor chip; and a second semiconductor chip formed with bumps on edges of a first surface and mounted over the substrate by interposing the first semiconductor chip and the first adhesive member such that a center of the first surface is attached over the first adhesive member and the bumps are bonded to the connection pads, with a second surface opposing to the first surface being polished evenly.

In an embodiment of the present invention, a method for manufacturing a stacked package includes: mounting a first semiconductor chip over a upper surface of a substrate having the upper surface formed with connection pads, a lower surface, and four side surfaces that couple the upper surface and the lower surface, forming a first adhesive member over the upper surface of the substrate to cover a portion of the upper surface of the substrate including the first semiconductor chip, mounting over the upper surface of the substrate a second semiconductor chip formed with bumps on edges of a first surface thereof the such that a center of the first surface is attached over the first adhesive member and the bumps are bonded to the connection pads of the substrate, and planariz-ing a second surface of the second semiconductor chip opposite to the first surface by polishing the second surface.

In an embodiment of the present invention, an electronic system includes a controller, an interface, an input/output unit, and a memory coupled with through a bus, the memory including a stacked package comprising: a substrate having an upper surface formed with connection pads, a lower surface, and four side surfaces; a first semiconductor chip mounted over the upper surface of the substrate; a first adhesive member that covers a portion of the upper surface of the substrate including the first semiconductor chip; and a second semiconductor chip formed with bumps on edges of a first surface and mounted over the substrate by interposing the first semiconductor chip and the first adhesive member such that a center of the first surface is attached over the first adhesive member and the bumps are bonded to the connection pads, with a second surface opposing to the first surface being polished evenly.

In an embodiment of the present invention, a memory card including a memory having a stacked package and a controller for controlling the memory, the stacked package comprising: a substrate having an upper surface formed with connection pads, a lower surface, and four side surfaces; a first semiconductor chip mounted over the upper surface of the substrate; a first adhesive member that covers a portion of the upper surface of the substrate including the first semiconductor chip; and a second semiconductor chip formed with bumps on edges of a first surface and mounted over the substrate by interposing the first semiconductor chip and the first adhesive member such that a center of the first surface is attached over the first adhesive member and the bumps are bonded to the connection pads, with a second surface opposing the first surface being polished evenly.

DETAILED DESCRIPTION

Hereafter, various embodiments of the present invention will be described in detail with reference to the accompanying drawings.

Figure 1:
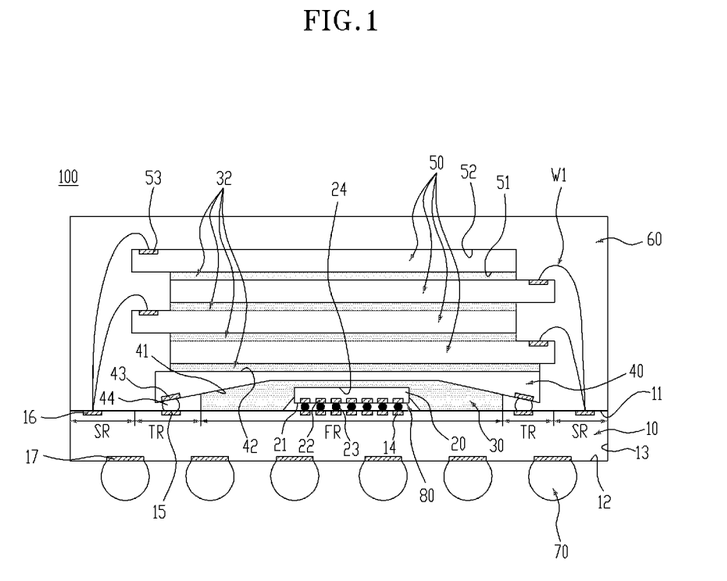
FIG. 1 is a cross-sectional view illustrating a stacked package in accordance with an embodiment of the present invention.

Referring to FIG. 1, a stacked package 100 in accordance with an embodiment of the present invention may include a substrate 10, a first semiconductor chip 20, a first adhesive member 30 and a second semiconductor chip 40. The stacked package may further include a plurality of third semiconductor chips 50, a mold part 60 and external connection terminals 70.

The substrate 10 may have a shape of a rectangular plate. The substrate 10 having a rectangular plate shape has an upper surface 11, a lower surface 12 and four side surfaces 13 that couple the upper surface 11 and the lower surface 12.

The upper surface 11 of the substrate 10 may be divided into a first region FR disposed in the center of the upper surface 11, a second region SR disposed in the periphery of the upper surface 11 and a third region TR disposed between the first region FR and the second region SR. The substrate 10 may be provided with first connection pads 14 in the first region FR, second connection pads 15 in the third region TR, third connection pads 16 in the second region SR and ball lands 17 on the lower surface 12.

Though not shown, the substrate 10 may include in the inside thereof a plurality of layers of wirings and conductive vias electrically coupling the wirings disposed in different layers. The first, second and third connection pads 14, 15 and 16 may be electrically coupled to the ball lands formed over the lower surface 12 of the substrate 10 through the wirings and conductive vias formed in the inside of the substrate 10.

The first semiconductor chip 20 is mounted over the first connection pads 14 of the substrate 10. Moreover, the first semiconductor chip 20 is mounted over the upper surface 11 of the substrate having the upper surface formed with the first connection pads 14, the lower surface 12, and four side surfaces 13 that couple the upper surface 11 and the lower surface 12.

In an embodiment, the first semiconductor chip 20 is provided with a first surface 21 formed with bonding pads 22, a second surface 24 which is opposite to the first surface 21 and bumps 23 formed over the respective bonding pads 22, and mounted over the substrate 10 in a flip-chip bonding manner such that the bumps 23 formed over the first surface 21 of the first semiconductor chip 20 are bonded to the first connection members 14 over the upper surface 11 of the substrate 10. Further, the bonding pads 22 of the first semiconductor chip 20 are electrically coupled to the first connection pads 14. In order to enhance joint reliability of the bumps 23, an underfill member 80 may be filled between the substrate 10 and the first semiconductor chip 20. After mounting the first semiconductor chip 20 and before forming the first adhesive member 30, the underfill member 80 may be filled between the first semiconductor chip 20 and the first adhesive member 30. The bonding pads 22 may be formed over the first surface 21 of the first semiconductor chip 20 which faces the substrate 10.

The first adhesive member 30 is formed over the upper surface 11 such that it covers the first region FR or a portion of the upper surface 11 of the substrate 10 including the first semiconductor chip 20. The second surface 24 of the first semiconductor chip which is opposite to the first surface 21 onto the upper surface 11 of the substrate 10 by medium of the first adhesive member 30. As the first adhesive member 30, a Penetrate Wafer Backside Lamination (PWBL) tape may be used.

The second semiconductor chip 40 has an area larger than the first semiconductor chip 20 and the first adhesive member 30, and is flip-chip bonded onto the substrate 10 with interposition of the first semiconductor chip 20 and the first adhesive member 30. The second semiconductor chip 40 may be mounted over the upper surface 11 of the substrate 10 with bumps 44 on edges of a first surface 41 thereof such that the center of the first surface 41 of the second semiconductor chip 40 is attached over the first adhesive member 30 and the bumps 44 are bonded to the second connection pads 15 of the substrate 10.

The second semiconductor chip 40 has a first surface 41 which faces the substrate 10 and a second surface 42 which is opposite to the first surface 41, and is provided with bonding pads 43 formed over the two edges of the first surface 41 and bumps 44 formed over the respective bonding pads 43.

The first surface 41 of the second semiconductor chip 40 has a concaved shape along the step formed by the first semiconductor chip 10, the first adhesive member 30 and the substrate 10 such that the center of the first surface 41 is attached over the first adhesive member 30 and the bumps formed over the two edges of the first surface 41 are bonded to the respective second connection pads 15 of the substrate 10. The second surface 42 of the second semiconductor chip 40 is polished by a grinding process, thereby having a planar shape. Accordingly, the second semiconductor chip 40 may be formed with bumps on edges of a first surface 41 thereof and mounted over the substrate 10 by interposing the first semiconductor chip 20 and the first adhesive member 30 therebetween such that the center of the first surface 41 of the second semiconductor chip 40 is attached over the first adhesive member 30 and the bumps are bonded to the connection pads 14, 15, 16 of the substrate 10, and a second surface 42 opposing to the first surface 41 being polished evenly.

The second semiconductor chip 40 may be a different type from the first semiconductor chip 20. For example, the second semiconductor chip 40 may be a volatile memory chip such as a DRAM or a non-volatile memory chip such as a FLASH and the first semiconductor chip 20 may be a logic chip that controls the second semiconductor chip 40. Alternatively, the second semiconductor chip 40 may be the same type as the first semiconductor chip 20.

The third semiconductor chips 50 may be stacked over the second surface 42 of the second semiconductor chip 40 by medium of second adhesive members 32.

Each of the third semiconductor chips 50 has a first surface 51 which faces the second semiconductor chip 40 and a second surface 52 which is opposite to the first surface 51. In an embodiment, the third semiconductor chips 50 are stacked in a zigzag shape such that their bonding pads 53 are exposed. Although the third semiconductor chips 50 are stacked in a zigzag shape in an embodiment, the third semiconductor chips 50 may be stacked vertically or in a stepped shape. The bonding pads 53 of the third semiconductor chips 50 and the third connection pads 16 of the substrate 10 are electrically coupled via wires W1.

The third semiconductor chip 50 may be the same type as the second semiconductor chip 40. For example, the second semiconductor chip 40 and the third semiconductor chip 50 may be a volatile memory chip such as a dynamic random-access memory (DRAM) or a non-volatile memory chip such as a FLASH and the first semiconductor chip 20 may be a logic chip that controls the second semiconductor chip 40. Alternatively, the second semiconductor chip 40 may be the same type as the first semiconductor chip 20.

The mold part 60 molds the upper surface 11 of the substrate 10 including the first semiconductor chip 20, the first adhesive member 30, the second semiconductor chip 40 and the third semiconductor chips 50. The mold part 60 may include an Epoxy Mold Compound (EMC).

Further, the respective ball lands 17 over the lower surface 12 of the substrate 10 are formed with the external connection terminals 70, and the stacked package 100 may be mounted over an external device (not shown), e.g. a package substrate by medium of the external connection terminals 70.

The invention is not limited to the embodiment as described above and may be realized in a variety of forms. These embodiments will be apparent from the following description with reference to FIGS. 2 and 3. Further, FIGS.

2-8 contain many of the same reference numerals as FIG. 1, and thus repeated descriptions are hereby omitted.

Figure 2:
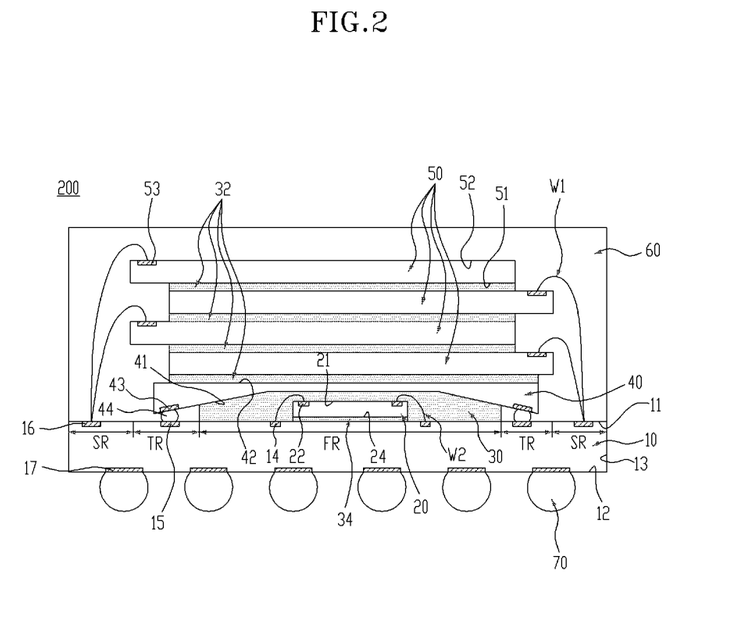
FIG. 2 is a cross-sectional view illustrating a stacked package in accordance with an embodiment of the present invention.

Referring to FIG. 2, a stacked package 200 in accordance with an embodiment has a structure in that the first semiconductor chip 20 is mounted over the substrate 10 in a wire bonding manner, unlike the stacked package 100 shown in FIG. 1 having the structure in that first semiconductor chip 20 is mounted over the substrate 10 in a flip-chip bonding manner.

Specifically, the second surface 24 of the first semiconductor chip 20 opposing to the first surface 21 over which the bonding pads 22 are disposed is attached onto the upper surface 11 of the substrate 10 by medium of the third adhesive member 34, and the bonding pads formed over the first surface 21 of the first semiconductor chip 20 are electrically coupled to the first connection pads 14 of the substrate 10 by medium of wires W2.

Figure 3:
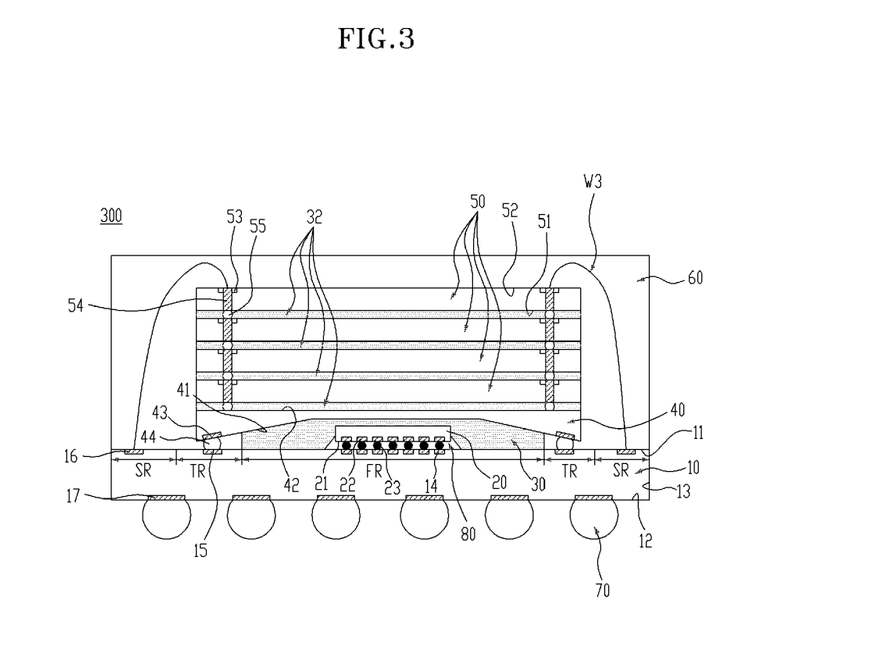
FIG. 3 is a cross-sectional view illustrating a stacked package in accordance with an embodiment of the present invention.

Referring to FIG. 3, a stacked package 300 in accordance with an embodiment has a structure in that the third semiconductor chips 50 are electrically coupled to one another via through electrodes 54 and the bonding pads 53 of the uppermost third semiconductor chip 50 are coupled to the third connection pads 16 of the substrate 10 by medium of wires W3, unlike the stacked package 100 shown in FIG. 1 having the structure in that the bonding pads 53 are individually coupled to the third connection pads 16 of the substrate 10 by medium of wires.

Specifically, each of the third semiconductor chips 50 is provided with through electrodes 54 that pass through the first surface 51 and the second surface 52 and are electrically coupled to the bonding pads 53 formed over the second surface 52. Although the third through electrodes 54 pass through the bonding pads 53 in an embodiment, the third through electrodes 54 may not pass through the bonding pads 53 and in this case the third through electrodes 54 may be electrically coupled to the bonding pads 53 via a circuit unit (not shown) formed in the inside of the third semiconductor chip 50.

The third semiconductor chips 50 are stacked over the second semiconductor chip 40 such that the through electrodes 54 are coupled to one another by medium of bumps 55.

The second adhesive member 32 is formed between the second semiconductor chip 40 and the lowermost third semiconductor chip 50 to attach them and between the third semiconductor chips 50 to attach them. The bonding pads 53 of the uppermost third semiconductor chip 50 and the third connection pads 16 of the substrate 10 are electrically coupled via the wires W3.

Hereafter, the process steps of manufacturing the stacked package in accordance with an embodiment of the present invention will be described with reference to FIGS. 4 to 8.

Figure 4:
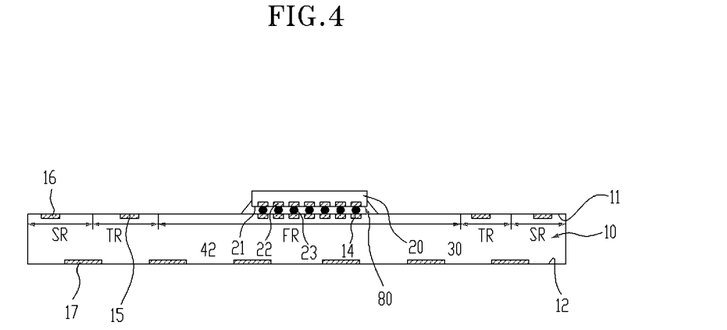
FIGS. 4 to 8 are views illustrating the process steps of manufacturing a stacked package in accordance with an embodiment of the present invention.

Referring to FIG. 4, the first semiconductor chip 20 is mounted over the first surface 11 of the substrate 10.

The upper surface 11 of the substrate 10 may be divided into the first region FR disposed in the center of the upper surface 11, the second region SR disposed in the periphery of the upper surface 11 and the third region TR disposed between the first region FR and the second region SR. The substrate 10 may be provided with the first connection pads 14 in the first region FR, the second connection pads 15 in the third region TR, the third connection pads 16 in the second region SR. The substrate 10 may further be provided with the ball lands 17 on the lower surface 12.

Though not shown, the substrate 10 may include in the inside thereof a plurality of layers of the wirings and the conductive vias electrically coupling the wirings disposed in different layers. The first, second and third connection pads 14, 15 and 16 may be electrically coupled to the ball lands formed over the lower surface 12 of the substrate 10 through the wirings and conductive vias formed in the inside of the substrate 10.

The first semiconductor chip 20 is provided with a plurality of the bonding pads 22 formed over the first surface 21 of the first semiconductor chip 20 and bumps 23 formed over the respective bonding pads 22, and may be mounted over the upper surface 11 of the substrate 10 in a flip-chip manner such that the bumps 23 are bonded onto the respective first connection pads 13 of the substrate 10.

Next, in order to enhance joint reliability of the bumps 23, the underfill member 80 may be filled between the substrate 10 and the first semiconductor chip 20.

Figure 5:
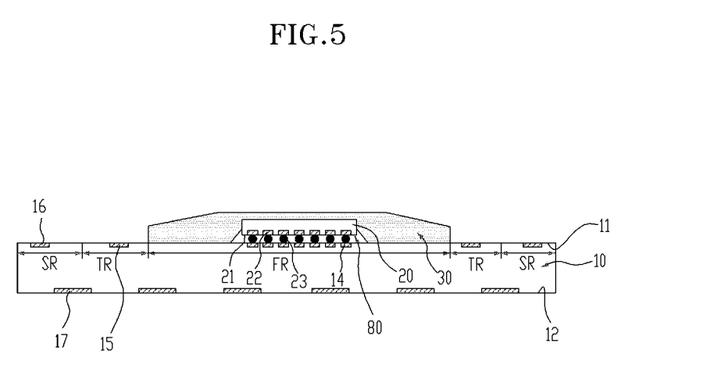

Referring to FIG. 5, the first adhesive member 30 that covers the first region FR of the substrate 10 including the first semiconductor chip 20 is formed. A PWBL tape may be used as the first adhesive member 30. Due to the height difference between the substrate 10 and the first semiconductor chip 20, the upper surface of the first adhesive member 30 may have an upwardly convex shape.

Figure 6:
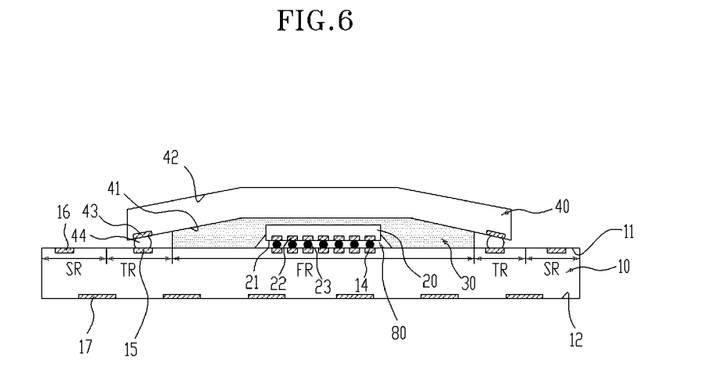

Referring to FIG. 6, the second semiconductor chip 40 having a larger area than the first semiconductor chip 20 and the first adhesive member 30 and formed with bumps 44 at two edges thereof is bent along the convex shape of the first adhesive member 30 and mounted over the substrate 10 such that a center of the first surface 41 of the second semiconductor chip 40 is attached onto the first adhesive member 30 and the bumps 44 are attached onto the respective second connection pads 15 of the substrate 10.

As the second semiconductor chip 40 is bent along the convex shape of the first adhesive member 30, the first surface 41 of the second semiconductor chip 40 has an inwardly concaved shape and the second surface 42 of the second semiconductor chip 40 which is opposite to the first surface 41 has an upwardly convex shape.

The second semiconductor chip 40 may be a different type from the first semiconductor chip 20. For example, the second semiconductor chip 40 may be a volatile memory chip such as a DRAM or a non-volatile memory chip such as a FLASH and the first semiconductor chip 20 may be a logic chip that controls the second semiconductor chip 40. Alternatively, the second semiconductor chip 40 may be the same type as the first semiconductor chip 20.

Figure 7:
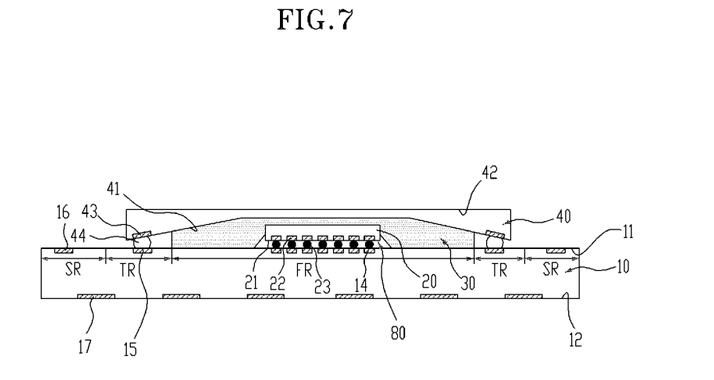

Referring to FIG. 7, the second surface 42 of the second semiconductor chip 40 which is opposite to the first surface 41 is polished through a grinding process, thereby being planarized.

Figure 8:
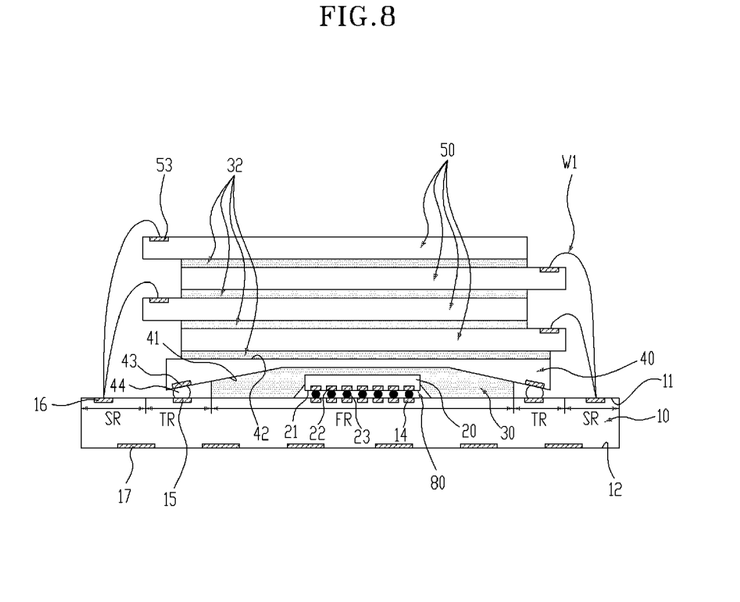

Referring to FIG. 8, a plurality of the third semiconductor chips 50 are stacked over the second surface 42 of the second semiconductor chip 40 by medium of the second adhesive member 32. In an embodiment, the third semiconductor chips 50 are stacked in a zigzag shape such that their bonding pads 53 are exposed. Although the third semiconductor chips 50 are stacked in a zigzag shape in an embodiment, the third semiconductor chips 50 may be stacked vertically or in a stepped shape.

The third semiconductor chip 50 may be the same type as the second semiconductor chip 40. For example, the second semiconductor chip 40 and the third semiconductor chip 50 may be a volatile memory chip such as a DRAM or a non-volatile memory chip such as a FLASH.

Next, the bonding pads 53 of the third semiconductor chips 50 and the third connection pads 16 of the substrate 10 are electrically coupled using the wires W1.

After that, the mold part 60 for molding the first, second and third semiconductor chips 20, 40 and 50 is formed over the upper surface 10 of the substrate 10 and the external connection terminals 80 are attached onto the ball lands 17 of the lower surface 12 of the substrate 10, thereby completing the fabrication of the stacked package 100 as shown in FIG. 1.

Although FIGS. 4 to 8 are illustrated for the fabrication of the stacked package 100 as shown in FIG. 1, the process steps may be modified to realize various embodiments.

For example, the stacked package 200 as shown in FIG. 2 may be fabricated by mounting the first semiconductor chip 20 not in a flip-chip bonding manner but in a wire bonding manner in the step of mounting the first semiconductor chip 20 described with reference to FIG. 4. The stacked package 300 as shown in FIG. 3 may be fabricated by using as the third semiconductor chip 50 a semiconductor chip formed with through electrodes 54 and electrically coupling the bonding pads 53 of the uppermost third semiconductor chip 50 and the third connection pads 16 of the substrate 10 using the wires W3 after stacking the third semiconductor chips 50 such that the through electrodes 54 are coupled to one another, in the step of stacking the third semiconductor chip 50.

With various embodiments as described above, surface flatness of the upper surface of the larger sized chip stacked over the smaller sized chip is ensured as the upper surface is polished, and thus it is possible to prevent defects, e.g. break between the stacked chips and poor wire bonding, caused as the surface flatness is not ensured due to the smaller sized lower chip when stacking the larger sized chip over the smaller sized chip. Furthermore, a semiconductor package with high capacity and high integration can be provided since limit in the number of stacked chips that is restricted by generation of the defects can be overcome and the number of stacked chips thus can be increased.

The stacked package in accordance with various embodiments may be applied to a variety of semiconductor devices and package modules.

Figure 9:
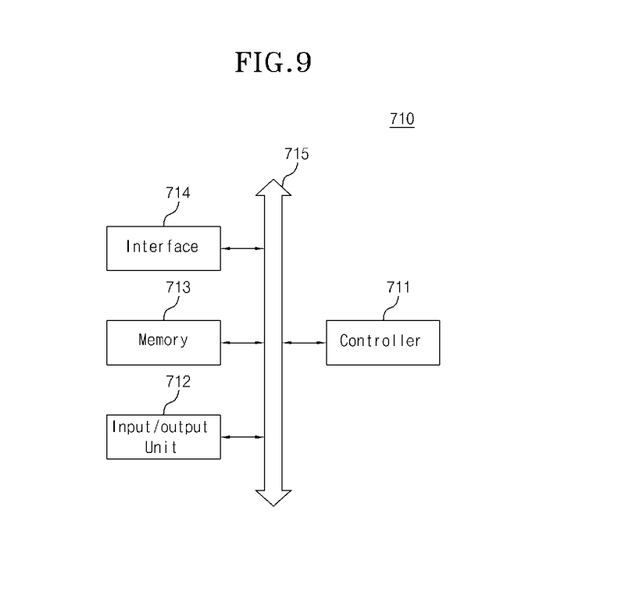
FIG. 9 is a block diagram showing an electronic system to which the stacked package in accordance with various embodiments of the present invention is applied.

Referring to FIG. 9, the stacked package in accordance with various embodiments may be applied to an electronic system 710. The electronic system 710 may include a controller 711, an input/output unit 712, and a memory 713. The controller 711, the input/output unit 712 and the memory 713 may be coupled with one another through a bus 715. The bus 715 serves as a path through which data move.

For example, the controller 711 may include at least any one of the following: one or more microprocessors, one or more digital signal processors, one or more microcontrollers, and logic devices capable of performing the same functions as these components. The memory 713 may include the stacked package according to various embodiments of the present invention. The input/output unit 712 may include at least one selected among a keypad, a keyboard, a display device, and so forth. The memory 713 is a device for storing data. The memory 713 may store data and/or commands to be executed by the controller 711 and the like.

The memory 713 may include a volatile memory device and/or a nonvolatile memory device, such as a flash memory. For example, a flash memory to which the technology of the invention is applied may be mounted to an information processing system such as a mobile terminal or a desktop computer. The flash memory may be constituted by a solid state drive (SSD). In this case, the electronic system 710 may stably store a large amount of data in a flash memory system.

The electronic system 710 may further include an interface 714 configured to transmit and receive data to and from a communication network. The interface 714 may be a wired or wireless type. For example, the interface 714 may include an antenna or a wired (or wireless) transceiver.

The electronic system 710 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 710 is an equipment capable of performing wireless communication, the electronic system 710 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 10:
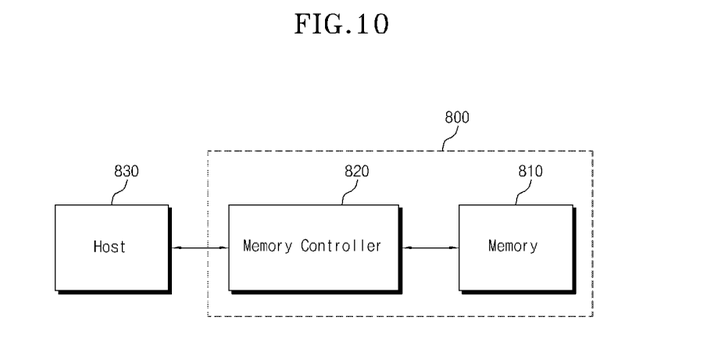
FIG. 10 is a block diagram illustrating a memory card having the stacked package in accordance with various embodiments of the present invention.

Referring to FIG. 10, the stacked package in accordance with various embodiments may be provided in the form of a memory card 800. For example, the memory card 800 may include a memory 810 such as a nonvolatile memory device and a memory controller 820. The memory 810 and the memory controller 820 may store data or read stored data.

The memory 810 may include at least any one among nonvolatile memory devices to which the packaging technology of the embodiments of the present invention is applied. The memory controller 820 may control the memory 810 such that stored data is read out or data is stored in response to a read/write request from a host 830.

While the invention has been described with respect to the specific embodiments, it will be apparent to those skilled in the art that various changes and modifications may be made without departing from the spirit and scope of the invention as defined in the following claims.

What is claimed is:
1. A stacked package, comprising:
    a substrate having an upper surface formed with connection pads, a lower surface, and four side surfaces;
    a first semiconductor chip mounted over the upper surface of the substrate;
    a first adhesive member that covers the first semiconductor chip and a portion of the upper surface of the substrate around the first semiconductor chip, wherein an upper surface of the first adhesive member has an upwardly convex shape; and
    a second semiconductor chip formed with bumps on edges of a first surface and mounted over the substrate by interposing the first semiconductor chip and the first adhesive member such that a center of the first surface is attached to the upper surface of the first adhesive member and the bumps are bonded to the connection pads, with a second surface opposing to the first surface being polished evenly,
    wherein the second semiconductor chip is bent along the convex shape of the upper surface of the first adhesive member, and the first surface of the second semiconductor chip has an inwardly concaved shape.
2. The stacked package of claim 1, wherein the first adhesive member comprises a Penetrate Wafer Backside Lamination (PWBL) tape.
3. The stacked package of claim 1, wherein the first semiconductor chip further comprises:
    bonding pads formed over a first surface of the first semiconductor chip which faces the substrate; and
    bumps formed on the bonding pads and bonded to the connection pads of the substrate.

4. The stacked package of claim 3, further comprising: an underfill member filled between the first semiconductor chip and the substrate.

5. The stacked package of claim 3, further comprising: an underfill member filled between the first semiconductor chip and the substrate.

6. The stacked package of claim 1, further comprising:
bonding pads formed over a first surface of the first semiconductor chip which does not faces the substrate;
wires for electrically coupling the bonding pads of the first semiconductor chip and the connection pads of the substrate; and
a third adhesive member for attaching a second surface of the first semiconductor chip which is opposite to the first surface to the substrate.

7. The stacked package of claim 1, wherein the first semiconductor chip is a different type from the second semiconductor chip.

8. The stacked package of claim 7, wherein the first semiconductor chip is a logic chip and the second semiconductor chip is a memory chip.

9. The stacked package of claim 7, wherein the first semiconductor chip is a logic chip and the second semiconductor chip is a memory chip.

10. The stacked package of claim 1, further comprising:
third semiconductor chips stacked over the second surface of the second semiconductor chip; and
wires for electrically coupling bonding pads of the third semiconductor chips to the connection pads of the substrate.

11. The stacked package of claim 10, wherein the third semiconductor chip is the same type as the second semiconductor chip.

12. The stacked package of claim 10, wherein the third semiconductor chip is the same type as the second semiconductor chip.

13. The stacked package of claim 1, further comprising:
a plurality of third semiconductor chips, each being formed with through electrodes and stacked over the second surface of the second semiconductor chip such that their through electrodes are coupled with each other; and
wires for electrically coupling the bonding pads of the uppermost third semiconductor chips to the connection pads of the substrate.

14. The stacked package of claim 1, wherein the first adhesive member comprises a Penetrate Wafer Backside Lamination (PWBL) tape.

15. The stacked package of claim 1, wherein the first semiconductor chip further comprises:
bonding pads formed over a first surface of the first semiconductor chip which faces the substrate; and
bumps formed on the bonding pads and bonded to the connection pads of the substrate.

16. The stacked package of claim 1, wherein the first semiconductor chip is a different type from the second semiconductor chip.

17. The stacked package of claim 1, further comprising:
third semiconductor chips stacked over the second surface of the second semiconductor chip; and
wires for electrically coupling bonding pads of the third semiconductor chips to the connection pads of the substrate.

18. The stacked package of claim 1, further comprising:
a plurality of third semiconductor chips, each being formed with through electrodes and stacked over the second surface of the second semiconductor chip such that their through electrodes are coupled with each other; and
wires for electrically coupling the bonding pads of the uppermost third semiconductor chips to the connection pads of the substrate.

19. A stacked package, comprising:
a substrate having an upper surface formed with connection pads, a lower surface, and four side surfaces;
a first semiconductor chip mounted over the upper surface of the substrate;
a first adhesive member that covers a portion of the upper surface of the substrate including the first semiconductor chip;
a second semiconductor chip formed with bumps on edges of a first surface and mounted over the substrate by interposing the first semiconductor chip and the first adhesive member such that a center of the first surface is attached over the first adhesive member and the bumps are bonded to the connection pads, with a second surface opposing to the first surface being polished evenly;
bonding pads formed over a first surface of the first semiconductor chip which does not faces the substrate;
wires for electrically coupling the bonding pads of the first semiconductor chip and the connection pads of the substrate; and
a third adhesive member for attaching a second surface of the first semiconductor chip which is opposite to the first surface to the substrate.

\* \* \* \* \*